(12) United States Patent
Hayner

(10) Patent No.: US 11,729,569 B2
(45) Date of Patent: Aug. 15, 2023

(54) DIMENSIONAL CONSISTENCY OF MINIATURE LOUDSPEAKERS

(71) Applicant: Bose Corporation, Framingham, MA (US)

(72) Inventor: Mark A. Hayner, Belmont, MA (US)

(73) Assignee: Bose Corporation, Framingham, MA (US)

( * ) Notice: Subject to any disclaimer, the term of this patent is extended or adjusted under 35 U.S.C. 154(b) by 652 days.

(21) Appl. No.: 16/598,618

(22) Filed: Oct. 10, 2019

(65) Prior Publication Data

US 2021/0112355 A1 Apr. 15, 2021

(51) Int. Cl.
*H04R 31/00* (2006.01)
*H04R 9/06* (2006.01)
*H04R 7/16* (2006.01)
*H04R 7/06* (2006.01)
*B81C 1/00* (2006.01)

(52) U.S. Cl.
CPC ....... *H04R 31/003* (2013.01); *B81C 1/00182* (2013.01); *H04R 7/06* (2013.01); *H04R 7/16* (2013.01); *H04R 9/06* (2013.01); *H04R 2231/003* (2013.01)

(58) Field of Classification Search
CPC .................................................. H04R 19/005
USPC ........................................................ 381/175
See application file for complete search history.

(56) References Cited

U.S. PATENT DOCUMENTS

| | | | | |
|---|---|---|---|---|
| 7,795,063 B2* | 9/2010 | Hsieh | ............... | B81C 1/00246 216/2 |
| 8,542,851 B2* | 9/2013 | Kasai | ............... | H04R 19/005 381/175 |
| 8,897,470 B2* | 11/2014 | Huang | ............... | B81C 1/0023 381/174 |
| 8,942,394 B2* | 1/2015 | Conti | ............... | H04R 31/00 381/174 |
| 8,948,419 B2* | 2/2015 | Zhang | ............... | H04R 19/04 381/174 |
| 9,913,042 B2* | 3/2018 | Bushko | ............... | B32B 38/18 |
| 10,609,489 B2* | 3/2020 | Guthy | ............... | H04R 9/06 |
| 2003/0099368 A1* | 5/2003 | Chiang | ............... | H04R 19/016 381/175 |

* cited by examiner

*Primary Examiner* — Suhan Ni
(74) *Attorney, Agent, or Firm* — Bose Corporation

(57) ABSTRACT

A semiconductor wafer has formed within it a plurality of piston tops of equal area. Each of the piston tops includes a thin flat region from which a majority of the thickness of the original semiconductor wafer may have been removed. A first one of the piston tops has a lower thickness than a second one of the piston tops. The second piston top has at least one hole in it, the volume of the hole corresponding to the difference in thickness between the first and second piston tops, such that the masses of the first and second piston tops differ by less than the variation in thickness between them.

9 Claims, 3 Drawing Sheets

DIMENSIONAL CONSISTENCY OF MINIATURE LOUDSPEAKERS

BACKGROUND

This disclosure relates to improving the dimensional consistency of miniature loudspeakers.

U.S. Pat. No. 9,913,042, titled MINIATURE DEVICE HAVING AN ACOUSTIC DIAPHRAGM, incorporated here by reference, describes a miniature electroacoustic transducer, i.e., a loudspeaker. The loudspeaker described in the '043 patent, shown in FIG. 1, resembles a conventional electrodynamic loudspeaker, with a moving voice coil 10 attached to a bobbin 12 that moves a sound-radiating diaphragm 14 suspended from a housing 16, but the entire assembly has a diameter on the order of 4 mm. The diaphragm 14 is a flat plate, rather than the usual cone shape used in larger loudspeakers, and the plate and bobbin assembly may be referred to as a piston. The voice coil and bobbin in combination with a magnetic assembly 18 is referred to as the motor of the transducer.

U.S. patent application Ser. No. 15/222,539, filed Jul. 28, 2016, titled FABRICATING AN INTEGRATED LOUDSPEAKER PISTON AND SUSPENSION, also incorporated here by reference, describes a way to fabricate a piston top and suspension for the transducer of the '043 patent using micro-electrical mechanical systems (MEMS) processes. In particular, the '539 application describes coating a silicon wafer 20, shown in FIG. 2, with liquid silicone rubber (LSR) 22, and etching away most of the wafer to leave a thin disc 24 suspended from a surrounding ring 26 by a circular section 28 of the LSR. The disc 24 is attached to the bobbin (12 in FIG. 1), and serves as the piston top, while the surrounding ring 26 is attached to the transducer housing (16 in FIG. 1).

U.S. patent application Ser. No. 15/975,461, filed May 9, 2018, titled IMPROVING EFFICIENCY OF MINIATURE LOUDSPEAKERS, also incorporated here by reference, describes some changes in the geometry of the piston and suspension described in the '539 application to improve the transducer's efficiency.

SUMMARY

In general, in one aspect, a semiconductor wafer has formed within it a plurality of piston tops of equal area. Each of the piston tops includes a thin flat region from which a majority of the thickness of the original semiconductor wafer may have been removed. A first one of the piston tops has a lower thickness than a second one of the piston tops. The second piston top has at least one hole in it, the volume of the hole corresponding to the difference in thickness between the first and second piston tops, such that the masses of the first and second piston tops differ by less than the variation in thickness between them.

Implementations may include one or more of the following, in any combination. The first and second piston tops may differ in thickness by more than fifty percent (50%), and differ in mass by less than twenty percent (20%). The first and second piston tops may differ in thickness by more than one hundred percent (100%). The first and second piston tops may differ in mass by less than ten percent (10%). A third one of the piston tops may have a greater thickness than the second piston top. The third piston top may have a greater number of holes in it than the second piston top, such that the masses of the first, second, and third piston tops differ by less than the variation in thickness between them. The third piston top may have at least one hole in it larger than the at least one hole in the second piston top, such that the masses of the first, second, and third piston tops differ by less than the variation in thickness between them. The second piston top may be located a greater distance from the center of the wafer than the first piston top. The hole in the second piston top may not extend through the entire thickness of the second piston top. The thickness of the piston tops may vary with each piston tops' distance from the center of the wafer, a plurality of the piston tops may each have a plurality of holes in them, and the total volume of the holes in each piston top may vary with the piston tops' distances from the center of the wafer, such that the mass of each given piston top differs from the average mass of all the piston tops by less than the variation in thickness between that piston top and the average thickness of all the piston tops.

In general, in one aspect, a plurality of piston tops is formed in a semiconductor wafer having a layer of compliant material on a first surface, by removing material from a second surface of semiconductor wafer opposite the first surface, to form within the wafer a plurality of flat piston tops of equal area suspended by the compliant material within a remaining portion of the semiconductor wafer. Each of the piston tops is a thin flat region from which a majority of the thickness of the original semiconductor wafer has been removed, a first one of the piston tops having a lower thickness than a second one of the piston tops as a result of the material removal step. Material is removed from the second piston top to form at least one hole, the volume of the hole corresponding to the difference in thickness between the first and second piston tops, such that the masses of the first and second piston tops differ by less than the variation in thickness between them.

In general, in one aspect, a plurality of diaphragm and suspension assemblies, are formed by depositing a layer of compliant material on a first surface of a solid substrate, and removing material from a second surface of the solid substrate, the removal leaving a plurality of blocks of substrate material suspended within other portions of the substrate material by the compliant material, the blocks providing the diaphragms. Additional material is removed to form holes in the blocks, the total volume of the holes in the blocks varying between blocks according to the position of the blocks on the wafer.

Implementations may include one or more of the following, in any combination. The step of removing material from the second surface may result in the plurality of blocks having thicknesses that vary between blocks according to the position of the blocks on the wafer, and the volume of the holes in the blocks may result in the mass of each given piston top differing from the average mass of all the piston tops by less than the variation in thickness between that piston top and the average thickness of all the piston tops.

In general, in one aspect, a semiconductor wafer has formed within it a plurality of piston tops of equal area, each of the piston tops includes a thin flat region from which a majority of the thickness of the original semiconductor wafer may have been removed. The thickness of the piston tops varies with the position of each different piston top on the wafer, and for at least a subset of the piston tops, the mass of each of the piston tops in the subset is uniform within a greater tolerance than the amount of thickness variation between the thinnest and thickest piston tops in the subset.

Advantages include improving the consistency of performance of transducers using pistons taken from different positions on a wafer substrate.

All examples and features mentioned above can be combined in any technically possible way. Other features and advantages will be apparent from the description and the claims.

DESCRIPTION

This application describes a modification to a loudspeaker such as described in U.S. Pat. No. 9,913,042 and/or as described in U.S. patent application Ser. No. 15/222,539, to improve the dimensional consistency of the loudspeaker, that is, how consistent at least one dimension is across different individual loudspeakers. In particular, the process described in the '539 application etches most of the material from the back of a silicon wafer to create a thin piston top. We have found that the depth of the deep reactive ion etch (DRIE) used to remove the bulk silicon, and the resulting thickness of the piston top created by this process, varies as a function of the position of the individual die on the overall wafer. Piston tops created near the center of the wafer tend to be thinner than those created closer to the edge, i.e., piston top thickness varies as a function of the radial position on the wafer of the individual die containing the piston top.

A result of this varying piston top thickness is that the mass of the piston, and therefore the moving mass of the transducer in which it is incorporated, varies. In particular, in one example, the piston top thickness ranged from 30 µm to 80 µm between wafers taken from the center of the wafer vs 60 mm from the center. That is, thickness varied by 167% across the wafer. The resulting difference in moving mass of the motor varied between 7.0 mg for units (or die) taken near the center and 8.3 mg for wafers taken near the edge of the waver, or 18% (the thin portion is not the only mass involved).

The piston thickness variation observed in practice is enough to cause performance variations in transducers assembled using such pistons. Since it is both the moving mass and the variation in the moving mass that matters to performance, the variability in thickness can be compensated for by making changes to the piston geometry that reduce its mass as a function of the radial position of a given piston on the wafer. Specifically, the thicker piston tops near the edge of the wafer can be made lighter by etching holes in them, removing via the holes at least some of the added mass that comes from their extra thickness.

Figure 1:
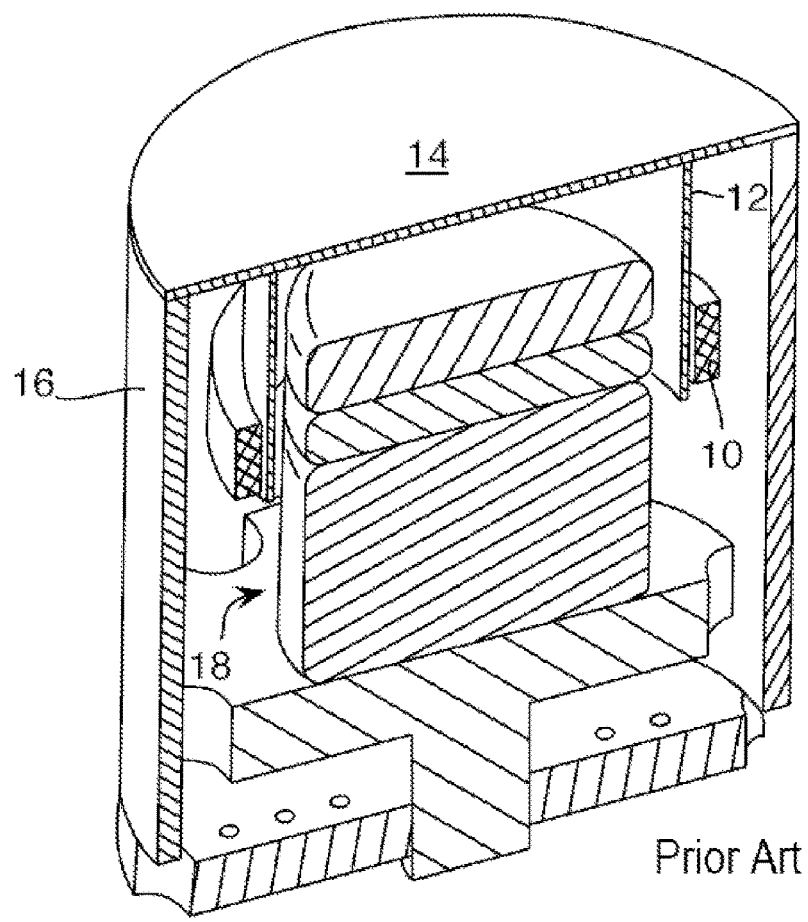
FIG. 1 shows a cross-section of a miniature loudspeaker.
Figure 2:
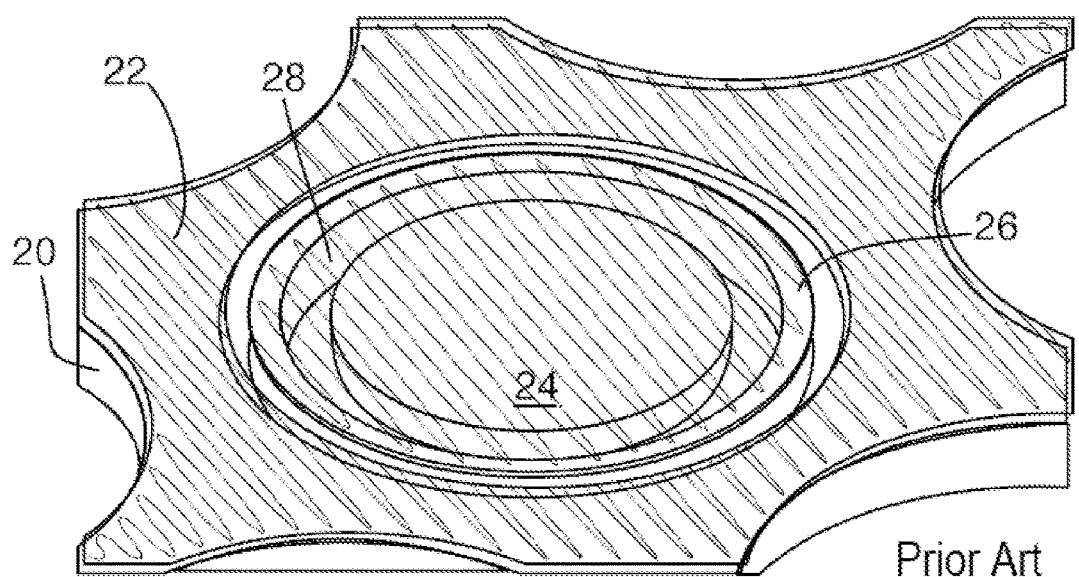
FIG. 2 shows a perspective view of the top of a silicon wafer etched to produce the piston top and suspension of the loudspeaker of FIG. 1.
Figure 3:
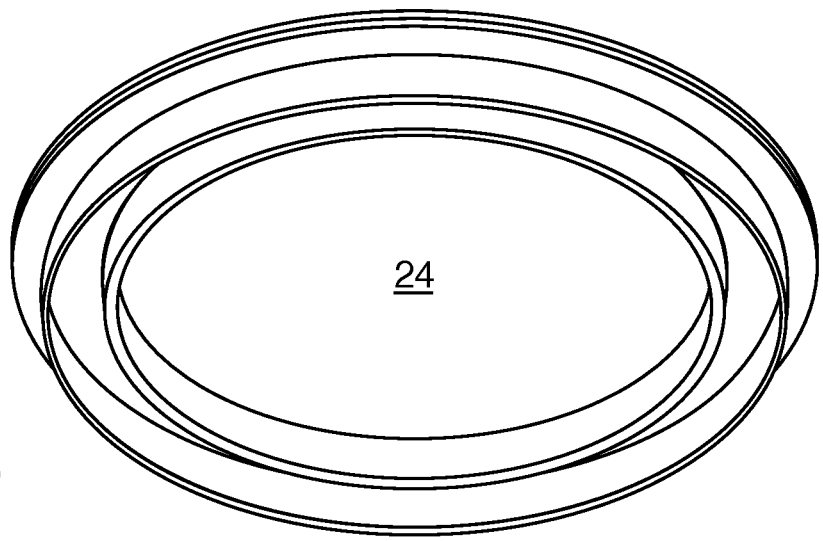
FIGS. 3, 4, and 5 show a perspective view of the bottom of three variations of the piston top and suspension of the loudspeaker of FIG. 1.
Figure 4:
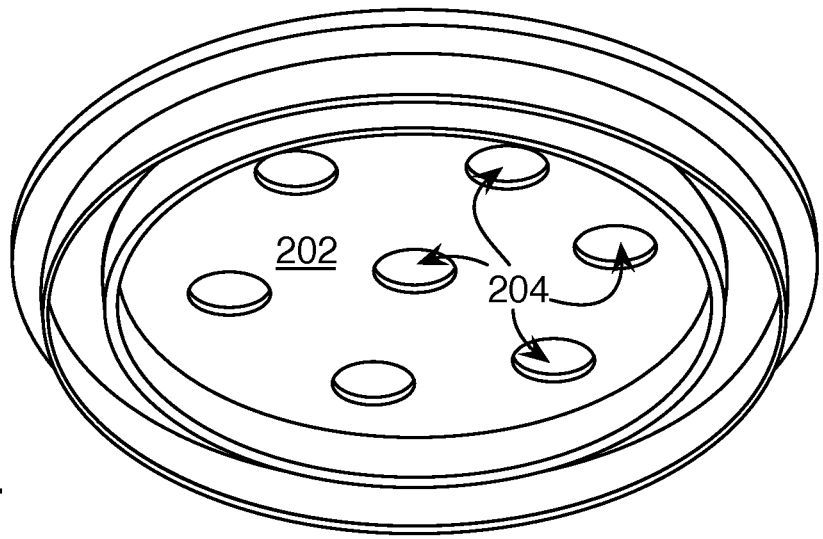
Figure 5:
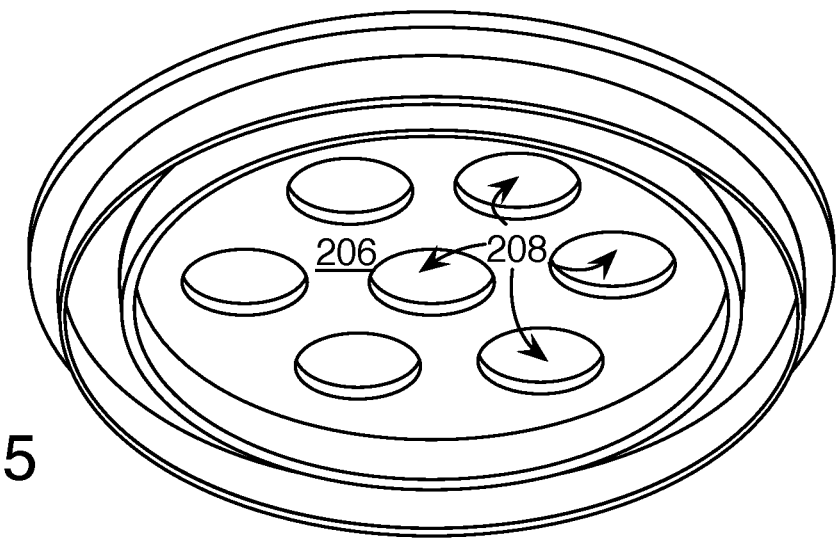

FIGS. 3, 4, and 5 show three example variations in piston top. In the example of FIG. 3, the wafer is unchanged, with a solid circular (or elliptical, as described in the '461 application) piston top 24. In the example of FIG. 4, a set of small holes 204 are etched in the piston top 202, reducing its mass relative to the solid piston of FIG. 3. In the example of FIG. 5, the holes 208 are larger, further reducing the mass of the piston top 206. In other examples, more small holes could be used, rather than an equal number (or fewer) large holes. In the example mentioned above, where the wafer thickness variation from 30 µm to 80 µm resulted in a mass variation of 18%, from 7.0 mg to 8.3 mg, a set of seven holes of 0.75 mm diameter in the 80 µm thick piston top would reduce the mass to 7.7 mg, a variation of only 10% from the 7.0 mg, 30 µm thick piston top.

In each of the examples, the hole sizes are small enough that any new resonances in the suspension, which stretches over the holes, will be higher in frequency than the operating band of the transducer, and will not create distortion in the sound it can produce. Such resonances may also be avoided by not etching the holes all the way through the wafer, which may be a natural consequence of their size, depending on the etch chemistry and dwell time.

The holes can be created by adding an additional mask and etch step to the fabrication, or by modifying the masks used in one of the existing steps. For example, in FIGS. 5H and 5I of the '539 application, reproduced in modified form as FIGS. 6A and 6B here, a mask 522 is used to pre-etch the locations 524, 525 in the wafer 502 where the later DRIE etch will cut the whole way through, freeing the piston and the frame from the substrate. As explained in the '539 application, the other layers seen in this figure are: thermal oxide ($SiO_2$) 504, 506, Chromium etch-stop 508, Liquid Silicone Rubber (LSR) 510, and photoresist 514, 518.

Figure 6A:
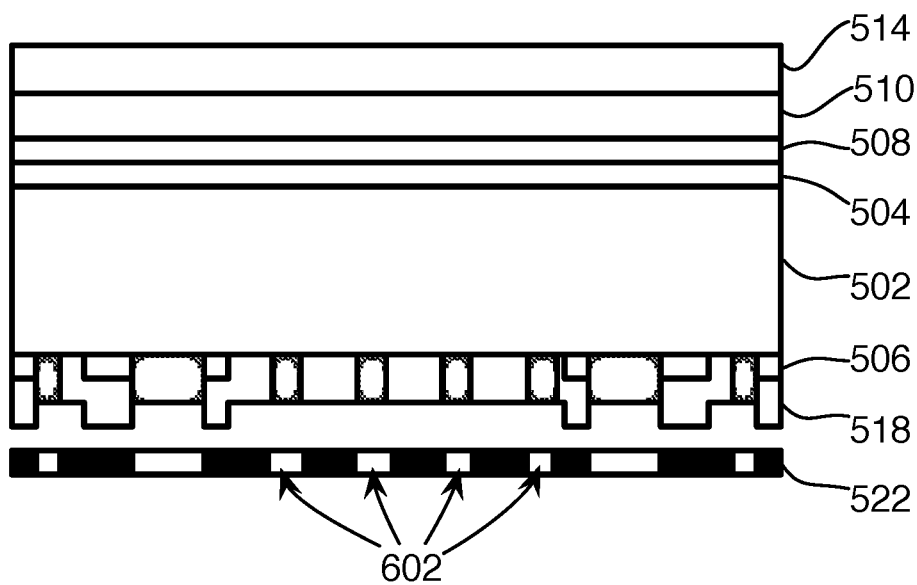
FIG. 6A through 6C show a subset of a MEMS fabrication processes for the piston and suspension of the transducer.
Figure 6B:
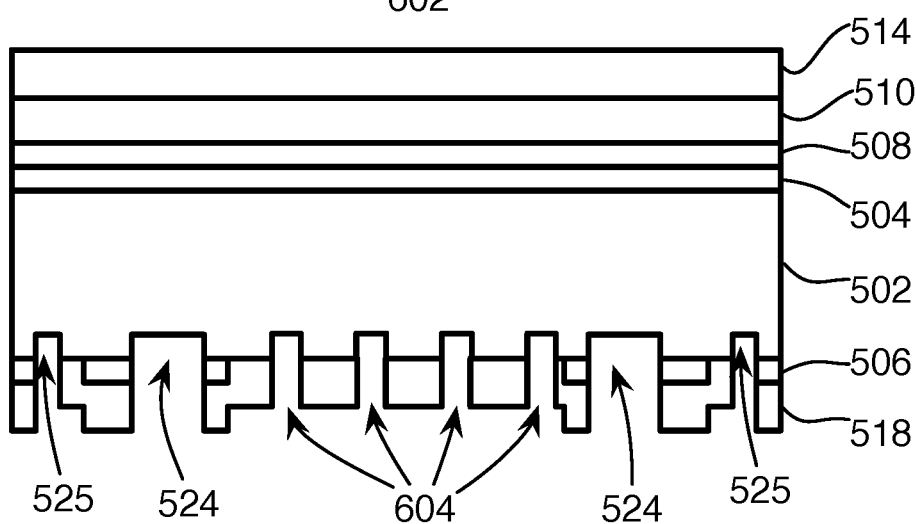
Figure 6C:
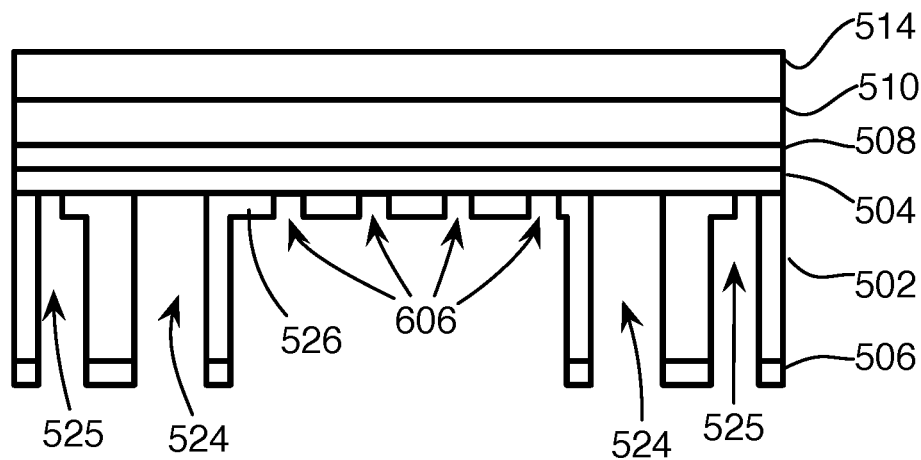

As shown in FIG. 6A, additional openings 602 in the modified mask 522 will pre-etch the hole locations 604 in the wafer, as seen in FIG. 6B. When the deep etch is performed in FIG. 6C, taken from FIG. 5J in the '529 application, the pre-etched hole locations result in holes 606 in the resulting piston top 526. Depending on the actual size of the holes in the mask, the new holes 606 may be too narrow to extend fully through the wafer, but as long as they remove enough mass from the piston top to compensate for the variation in etch thickness with wafer position, the goal is achieved. In particular, due to take-up of fluorine radicals by open areas of silicon, small features tend to etch more slowly than larger features, and densely-packed features etch more slowly than similarly-sized isolated features. Thus, more, smaller holes may not etch all the way through in an etch step that is timed to etch larger areas, such as channels 524 and 525, through to the next layer.

A different version of mask 522, with different sizes and densities of holes 602, may be used at different wafer positions, so that more or larger holes 606 are etched farther from the center of the wafer, where the etch has been observed to be less deep, leaving a thicker piston top. Alternatively, a separate mask-and-etch step could be inserted between other steps to create the needed holes. Modifying the hole size as a function of wafer position can be accomplished by using different masks for different wafer positions, or using variable mask elements, depending on the particular photolithography or other semiconductor fabrication process used to mask the etching of the wafer.

A number of implementations have been described. Nevertheless, it will be understood that additional modifications may be made without departing from the scope of the inventive concepts described herein, and, accordingly, other embodiments are within the scope of the following claims.

What is claimed is:
1. An apparatus comprising:
a semiconductor wafer having formed within it a plurality of piston tops of equal area each of the plurality of piston tops having a mass, each of the piston tops comprising a thin flat region from which a majority of a thickness of the original semiconductor wafer has been removed,
wherein
a first one of the piston tops has a lower thickness than a second one of the piston tops, and
the second piston top has at least one hole in it, a volume of the hole corresponding to a difference in thickness between the first and second piston tops, such that the masses of the first and second piston tops differ by less than a variation in thickness between them, and wherein the hole in the second piston top does not extend through the entire thickness of the second piston top.

2. The apparatus of claim 1, wherein the first and second piston tops differ in thickness by more than fifty percent (50%), and differ in mass by less than twenty percent (20%).

3. The apparatus of claim 2, wherein the first and second piston tops differ in thickness by more than one hundred percent (100%).

4. The apparatus of claim 2, wherein the first and second piston tops differ in mass by less than ten percent (10%).

5. The apparatus of claim 1, wherein a third one of the piston tops has a greater thickness than the second piston top.

6. The apparatus of claim 5, wherein the third piston top has a greater number of holes in it than the second piston top, such that the masses of the first, second, and third piston tops differ by less than the variation in thickness between them.

7. The apparatus of claim 5, wherein the third piston top has at least one hole in it larger than the at least one hole in the second piston top, such that the masses of the first, second, and third piston tops differ by less than the variation in thickness between them.

8. The apparatus of claim 1, wherein the second piston top is located a greater distance from the center of the wafer than the first piston top.

9. The apparatus of claim 1, wherein:
the thickness of the piston tops varies with each piston tops' distance from the center of the wafer,
a plurality of the piston tops each have a plurality of holes in them, and
the total volume of the holes in each piston top varies with the piston tops' distances from the center of the wafer,
such that the mass of each given piston top differs from the average mass of all the piston tops by less than the variation in thickness between that piston top and the average thickness of all the piston tops.

* * * * *